United States Patent
Moll et al.

(10) Patent No.: US 6,762,480 B2
(45) Date of Patent: Jul. 13, 2004

(54) THIN GALLIUM-ARSENIDE-ANTIMONIDE BASE HETEROJUNCTION BIPOLAR TRANSISTOR (HBT) HAVING IMPROVED GAIN

(75) Inventors: Nicolas J. Moll, Woodside, CA (US); Colombo R. Bolognesi, Port Moody (CA)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/796,299

(22) Filed: Feb. 27, 2001

(65) Prior Publication Data

US 2002/0145137 A1 Oct. 10, 2002

(51) Int. Cl.⁷ .................... H01L 27/082; H01L 27/102; H01L 29/70; H01L 31/11
(52) U.S. Cl. .................................................. 257/592
(58) Field of Search .................... 257/12, 19, 17, 257/18, 51, 58, 90, 91, 94, 592, 593, 85

(56) References Cited

U.S. PATENT DOCUMENTS

| | | | |
|---|---|---|---|
| 4,821,082 A | 4/1989 | Frank et al. ................... 357/34 |
| 5,349,201 A | * 9/1994 | Stanchina et al. ............. 257/18 |
| 5,387,808 A | * 2/1995 | Nozu ......................... 257/197 |
| 6,251,738 B1 | * 6/2001 | Huang ........................ 438/312 |
| 6,316,795 B1 | * 11/2001 | Croke, III ................... 257/197 |
| 6,339,233 B1 | * 1/2002 | Lell ........................... 257/195 |
| 6,388,307 B1 | * 5/2002 | Kondo et al. ................ 257/592 |
| 2002/0027232 A1 | * 3/2002 | Shigematsu et al. ......... 257/197 |

FOREIGN PATENT DOCUMENTS

| EP | 0 571 994 | 12/1993 |
| EP | 571994 A2 | * 12/1993 |
| JP | 06224230 A | * 8/1994 |
| WO | WO 01 09957 | 2/2001 |

OTHER PUBLICATIONS

S.M. Sze, Semiconductor Devices Physics and Technology 1985, Bell Telephone Labratories, Inc., pp. 267 and 268.*
Ion Thomas, Principle of Electronics 1992, McGraw–Hill Companies, Inc., Part I, p. 3.6.*
Dvorak, M.W. et al. "MOCVD–Grown 175 Ghz Inp/GaAsxSb 1–x/InP DHBTs with High Current Gains using Strained and Heavily C–Doped Base Layers", 58$^{th}$ Device Research Conference, Denver, CO, Jun. 19–21, 2000, pp. 143–144.
Bolognesi, C.R. et al., "High–Performance InP/GaAsSb/InP DHBTs with Heavily Doped Base Layers", Proceedings 2000 IEEE/Cornell Conference on High–Performance Devices, Aug. 7–9, 2000, pp. 12–19.
Oka, T. et al., "Low Turn–On Voltage GaAs Heterojunction Bipolar Transistors with a Pseudomorphic GaAsSb Base", Applied Physics Letters, American Institute of Physics, New York, vol. 78, No. 4, Jan. 22, 2001, pp. 483–485.

(List continued on next page.)

Primary Examiner—Wael Fahmy
Assistant Examiner—Dana Farahani

(57) ABSTRACT

An HBT having an InP collector, a GaAsSb base and an InP emitter in which the base is constructed using a thin layer of GaAsSb. The thin base layer can be constructed of a GaAsSb material with a composition having a bulk lattice constant that matches the bulk lattice constant of the material of the collector. The thickness of the GaAsSb base layer is less than 49 nm, and preferably less that about 20 nm. Alternatively, the thin base layer is of a GaAsSb composition that includes a higher As content, resulting in a low conduction band energy discontinuity at the emitter-base junction. Such a GaAsSb base layer has a lattice constant that conforms to the lattice constant of the collector because it is thinly grown so as to be pseudomorphically "strained" over the collector. A high base doping level is used to reduce the sheet resistivity and lower the base series resistance that results from the thinly grown base layer.

39 Claims, 7 Drawing Sheets

OTHER PUBLICATIONS

Sullivan, G.J. et al., "MBE Growth and Characterization of High Gain AlGaAs/GaAsSb/GaAs NPN HBTs" Gallium Arsenide and Related Compounds, Washington, Sep. 9–12, 1991, pp. 647–650.

Dvorak, M.W. et al., "Abrupt Junction InP/GaAsSb/InP Double Heterojunction Bipolar Transistors with F/subT/as High as 250 Ghz and BV/sub CEO/>6 V", International Electron Devices Meeting, San Francisco, Dec. 10–13, 2000, pp. 178–181.

Matine, N. et al., "Electrical Stress Damage Reversal in Non–Passivated Fully Self–Aligned InP HBTs by Ozone Surface Treatment", Electronics Letters, vol. 35, No. 25, Dec. 9, 1999, pp. 2229–2231.

Watkins, S.P. et al., "Heavily Carbon–Doped GaAsSb Grown on InP for HBT Applications", Journal of Crystal Growth, vol. 221, No. 1–4, pp. 59–65.

* cited by examiner

THIN GALLIUM-ARSENIDE-ANTIMONIDE BASE HETEROJUNCTION BIPOLAR TRANSISTOR (HBT) HAVING IMPROVED GAIN

TECHNICAL FIELD

The invention relates generally to transistors, and, more particularly, to a heterojunction bipolar transistor (IBT) having a thin gallium arsenide antimonide (GaAsSb) base.

BACKGROUND OF THE INVENTION

Heterojunction bipolar transistors (BBTs) have become state of the art, particularly in npn form, for applications in which high switching speeds and high frequency operation are desired.

An indium gallium arsenide (InGaAs) base HBT typically includes an indium phosphide (InP) or aluminum indium arsenide (AlInAs) emitter that is lattice matched to an InGaAs base and doped with carbon (C) or beryllium (Be) in the range of $3-6 \times 10^{19}$ acceptors/cm$^3$. This has led to the development of HBTs having bases of InGaAs at least as thick as 50 nanometers (nm). This minimum thickness has been arrived at due to the generally accepted upper limit of base doping of about $6 \times 10^{19}$ acceptors/cm$^3$, and the generally accepted lithography limit of about 1 micron ($\mu$m). This leads to the conclusion that the use of a substantially thinner base would lead to an excessively large base resistance, rendering the HBT inadequate for high frequency operation due to the resultant low maximum operational frequency $f_{MAX}$. The approximate relationship $f_{MAX} = \sqrt{f_{T/8\pi R_b C_c}}$, where $f_T$ is the current-gain-bandwidth product, or cutoff frequency, $R_b$ is the base series resistance and $C_c$ is the collector-base capacitance, shows that as the base resistance increases, $f_{MAX}$ is reduced. The relationship is approximate because it is based on a simple lumped-element model of the transistor. Actually, the base series resistance $R_b$ and collector-base capacitance $C_c$ are distributed. More accurate expressions are algebraically complex and would obscure, rather than illuminate, the points that this approximate expression is used to make.

The base series resistance, $R_b$, can be reduced by scaling down the lithography used to fabricate the transistor, but the practical lower limit is approximately 1 $\mu$m. $R_b$ can also be reduced by increasing the base doping, but in ordinary bipolar transistors the emitter efficiency, and hence the current gain, will be seriously compromised as the magnitude of the base doping approaches that of the emitter. This effect of base doping on emitter efficiency is reduced or removed in an HBT due to the wider bandgap of the emitter material compared to the base material. The emitter having a wider bandgap than the base reduces the reverse injection from the base into the emitter even at high base doping. However, in existing HBTs, the base doping cannot be increased without limit because the current gain becomes too small for other reasons.

The doping dependence of the base sheet resistance, transit time, and recombination time is given by the equations:

$$\rho_B = 1/qN_A\mu_p W_B \approx K_o/N_A^{(1-\epsilon)} W_B \quad \text{(Eq. 1)}$$

$$1/\tau_B = 1/\tau_{SRH} + 1/\tau_{RAD} + 1/\tau_{AUGER} = A + BN_A + CN_A^2, \text{ and} \quad \text{(Eq. 2)}$$

$$\tau_T = \frac{W_B}{V_{thermal}} + \frac{W_B^2}{2D_n} \quad \text{(Eq. 3)}$$

The term $\rho_B$ is the base sheet resistance, q is the charge of an electron, $N_A$ is the doping concentration in the base, $\mu_p$ is the hole mobility in the base, $W_B$ is the base thickness, $K_o$ is a constant, and $\epsilon$ is a constant that can be used to empirically describe the dependence of hole mobility on doping. The term $\tau_B$ is the net electron lifetime in the base, which has the relationship shown to the lifetimes $\tau_{SRH}$ for Shockley-Read-Hall recombination, $\tau_{RAD}$ for radiative recombination, and $\tau_{AUGER}$ for Auger recombination. A, B, and C are constants that can be use to empirically describe the dependence of $\tau_B$ on the base doping. The base transit time $\tau_T$ depends as shown on the base thickness, the electron thermal velocity $v_{thermal}$, and the electron diffusion constant $D_n$.

The constants $K_o$, $\epsilon$, A, B, C, and $D_n$ in equations 1, 2 and 3 are material dependent. Therefore, the scaling behavior with respect to the thickness of the base layer is material dependent. The values for InGaAs lattice-matched to InP are well known, and therefore, will be used as an example when scaling the base of an HBT. For most degenerately doped materials (nearly always the case in HBT bases) $\mu_p$ is weakly dependent on the doping level, and $\epsilon$ is a small positive number. Assuming that this dependence is negligible, and using representative numbers for the other material parameters obtained from R. K. Ahrenkiel et al., "Recombination lifetime of In0.53 Ga0.47 As as a function of doping density," Appl. Phys. Lett., V.72, pp. 3470 ff. (1998); and from Y. Betser and D. Ritter, "Electron transport in heavily doped bases of InP/GaInAs HBTs probed by magnetotransport experiments," IEEE Trans. Elec. Dev., V.43, pp. 1187 ff. (1996), the scaling behavior for an InGaAs base HBT is obtained.

FIG. 1 illustrates the scaling behavior for $f_T$, $f_{MAX}$, and the base doping in an InGaAs base HBT constrained to have a current gain of 50 as a function of the base layer thickness. The cutoff frequency $f_T$ and the maximum operating frequency $f_{MAX}$ are shown with respect to the left axis and the base doping is shown with respect to the right axis. As illustrated, due to the strong dependence of base recombination on doping density, scaling below a base thickness of approximately 36 nm significantly degrades $f_{MAX}$. This occurs because the base sheet resistance increases as the base thickness is reduced.

Therefore, there is a need in the industry for an HBT having a high current gain that can be maintained at high operating frequencies.

SUMMARY OF THE INVENTION

The invention is an HBT having an InP collector, a GaAsSb base and an InP emitter in which the base is constructed using a thin layer of GaAsSb. The thin base layer can be constructed of a GaAsSb material with a composition having a bulk lattice constant that matches the bulk lattice constant of the material of the collector. The thickness of the GaAsSb base layer is less than 49 nm, and preferably less that about 20 nm. A high base doping level is used to reduce the sheet resistivity and lower the base series resistance that results from the thinly grown base layer. The emitter may also be constructed using AlInAs in a composition that results in a lattice-matched with the InP collector.

In an alternative embodiment, the thin base layer is of a GaAsSb composition that includes a higher As content, resulting in a low conduction band energy discontinuity at the emitter-base junction. The thin layer of GaAsSb forming the base of the HBT can be grown using a composition that includes an arsenic fraction of as high as approximately 65%. While providing an advantageous decrease in the conduction band energy discontinuity, an arsenic fraction in the GaAsSb of greater than about 51% changes the lattice parameter of the GaAsSb base layer so that, if grown conventionally thick, undesirable dislocations would occur. To prevent the dislocations from forming, the GaAsSb base layer is grown to a thickness not to exceed the critical thickness at which dislocations would form. Such a GaAsSb base layer has a lattice constant that conforms to the lattice constant of the collector because it is pseudomorphically "strained" over the collector. A high base doping level is used to reduce the sheet resistivity and lower the base series resistance that results from the thinly grown base layer.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the invention.

DETAILED DESCRIPTION OF THE INVENTION

While described below using an npn heterojunction bipolar transistor (HBT) the invention is equally applicable to an EBT having a pnp configuration.

The material used to fabricate the emitter in an HBT has a bandgap wider than the bandgap of the material used to fabricate the base. This creates an energy barrier in the valence band at the emitter-base junction that inhibits the unwanted flow of holes from the base region to the emitter region. This arrangement increases the emitter injection efficiency, current gain and operating frequency of the HBT.

Figure 2:
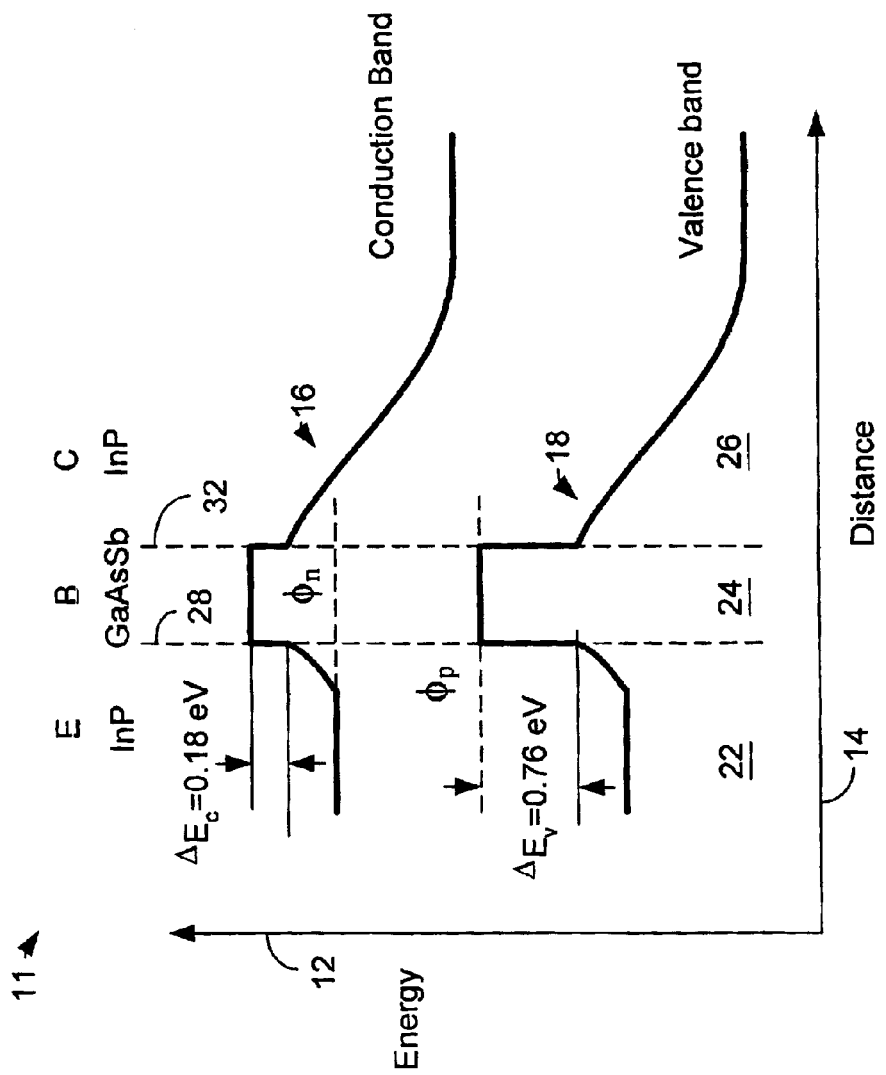
FIG. 2 is a graphical illustration showing an energy band diagram of a conventional InP emitter/GaAsSb base/InP collector HBT under modest forward electrical bias on the emitter-base junction.

FIG. 2 is a graphical illustration showing an energy band diagram 11 of a conventional InP emitter/GaAsSb base/InP collector HBT under modest forward electrical bias on the emitter-base junction. The vertical axis 12 represents the energy level and the horizontal axis 14 represents distance. That is, the thickness of the material that respectively comprises the emitter region 22, the base region 24 and the collector region 26. An HBT with a GaAsSb base and InP collector has a type-II band lineup at the collector-base junction 32 as shown. The energy discontinuity $\Delta E_c$ in the conduction band 16 is about 0.18 electron Volts (eV) and the energy discontinuity $\Delta E_v$ in the valence band 18 is about 0.76 eV. This is an essentially ideal band lineup for this junction for the following reasons. A small ballistic energy $\Delta E_c$ is imparted to collected electrons and there is a large valence-band discontinuity $\Delta E_v$ at the base-collector junction 32 that minimizes hole injection into the collector region 26 even at low or positive collector bias. Since the wide-bandgap InP extends throughout the collector region 26, avalanche breakdown is minimized.

Other variations of InP collector HBTs fail to offer these advantages. For example, the use of the same structure, but with an InGaAs base retains the large valence band discontinuity $\Delta E_v$ at the collector-base junction and includes the benefit of the wide-bandgap InP. Unfortunately, the InGaAs base presents a barrier to electron collection, which could result in undesirable stored charge in the base. This compromises the frequency response and maximum current capability of the device. Any scheme to eliminate this barrier compromises the desired features of the large valence band discontinuity $\Delta E_v$ at the collector-base junction and the benefit of the wide-bandgap InP.

However, in HBTs having a GaAsSb base and InP emitter (the characteristics of which are shown in FIG. 2) the type II band lineup leads to two undesirable features. Both are related to the discontinuity in the electron concentration across the heterojunction of $\exp(-q\Delta E_c/kT)$, where q is the electron charge, $\Delta E_c$ is the conduction band discontinuity, k is Boltzmann's constant, and T is the absolute junction temperature. Since $\Delta E_c$ is approximately 0.18+/−0.1 eV, the ratio of electron concentration across the discontinuity is in the range of $2\times10^{-5}$ to $5\times10^{-2}$ at room temperature.

The first undesirable feature is lowered current gain. Below some limiting injection level, it can be shown that interface recombination at the emitter-base junction 28 depends on the electron concentration on the emitter side of the junction, and on the interface trap properties.

The interface current density $j_{interface}=qn_{emitter}v_{interface}$, where $n_{emitter}$ is the electron density on the emitter side of the interface and where $v_{interface}$ is the interface recombination velocity. The interface recombination velocity $v_{interface}=\sigma_n v_{thermal} N_{traps}+K_{s\_i\_rad}\, p_{base}$, where $\sigma_n$ is the cross-section for capture of an electron by an interface trap, $v_{thermal}$ is the thermal velocity of electrons, $N_{traps}$ is the trap concentration as a density per unit area, $K_{s\text{-}i\text{-}rad}$ is a constant that describes the proportionality of spatially indirect radiative recombination at the interface. The term $p_{base}$ is the hole concentration on the base side of the interface.

The total interface recombination velocity is thus due to recombination through traps, and through spatially indirect radiative recombination. The material interface, as it can be practically grown, will not be electrically perfect. For example, there may be impurities or imperfections at the interface that lead to spatially localized states; inside the energy gap. Electrons or holes that land in these spatially localized states; cannot move around (unlike electrons or holes in the conduction or valence bands). These spatially localized states have a potential energy between that of the valence and conduction bands. These spatially localized states can alternately trap electrons and holes, thereby providing a path for recombination. This is conceptually similar to Schockley-Read-Hall recombination.

Spatially indirect recombination is band-to-band recombination between electrons that are localized on one side of a type-II heterojunction (in this example the InP side) and holes that are localized on the other side (in this example the GaAsSb side). The recombination is referred to as spatially indirect because the electrons and holes are separated according to classical physics. According to quantum physics the electrons and holes are not perfectly localized. They are represented by wave functions that slightly overlap. Therefore, some recombination occurs. Both of these effects are known to those having ordinary skill in the art.

The injection current density $j_{injection}=qn_{base}v_{base}$, where $n_{base}$ is the injected electron concentration on the base side of the emitter-base junction and where $v_{base}$ is the electron velocity through the base. The ratio $j_{injection}/j_{interface}= v_{base}n_{base}/v_{interfac}n_{emitter}$ represents an upper limit to the current gain of the transistor. The ratio of electron density on either side of the emitter-base junction leads to an effective multiplication of the interface recombination velocity by exp $(q\Delta E_c/kT)$, directly affecting the current gain.

Figure 3:
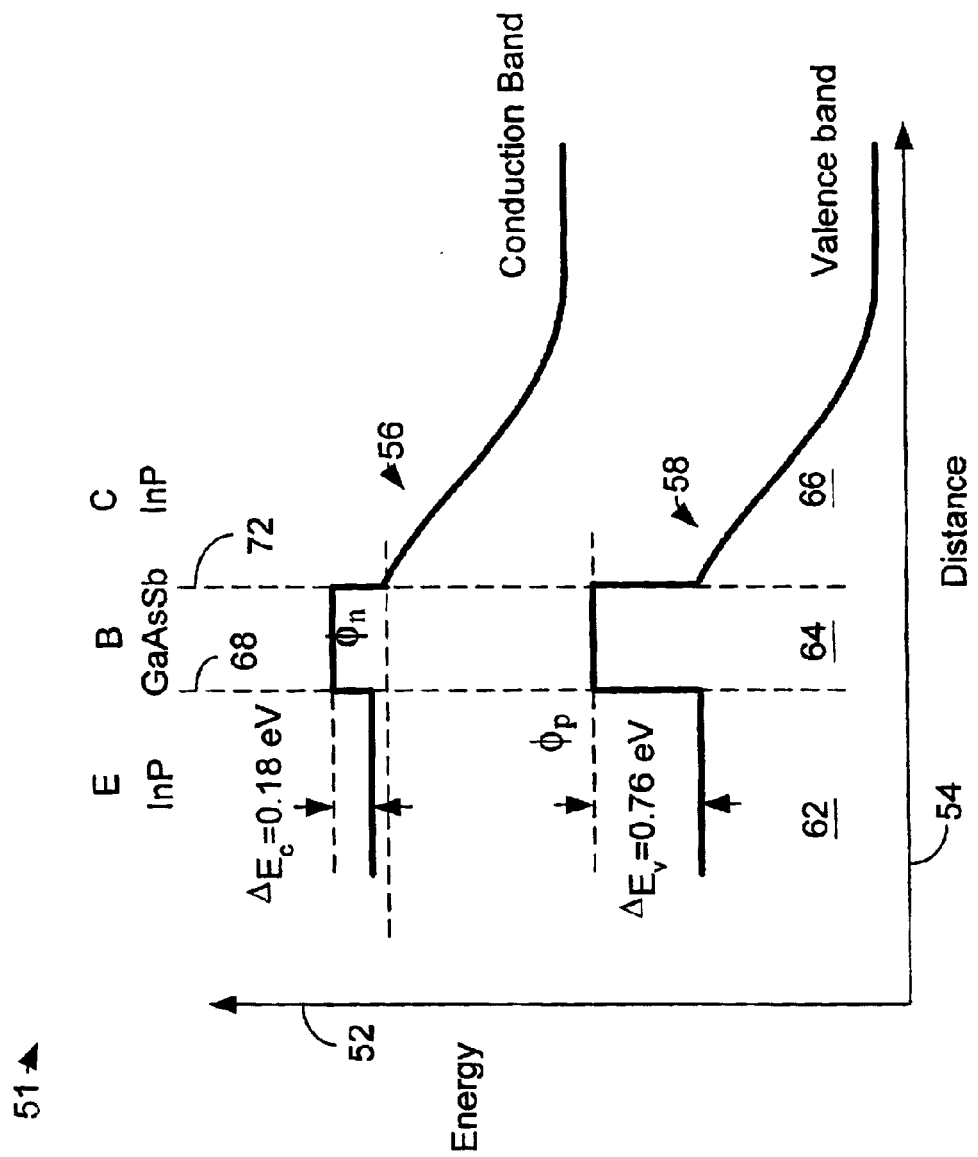
FIG. 3 is a graphical illustration showing an energy band diagram of the InP emitter/GaAsSb base/InP collector HBT of FIG. 2 at strong forward bias on the emitter-base junction.

The second undesirable feature in an HBT having a GaAsSb base and InP emitter is a reduction of the current at which current gain compression occurs. In a typical HBT, a relatively low emitter doping $N_e$ is used to reduce the emitter-base capacitance. The use of a certain emitter doping concentration places a hard upper limit, of $N_e \exp(-q\Delta E_c/kT)$, on the injected electron density in the base. This is illustrated by the energy band diagram 51 in FIG. 3, which represents the characteristics of the InP/GaAsSb/InP HBT of FIG. 2 at a strong forward bias on the emitter-base junction 68. As this bias is approached, the emitter capacitance becomes quite large and the frequency response is rapidly lowered. For purely diffusive transport, the electron velocity through the base, denoted by $v_{base}$, is on the order of $10^7$ cm/sec in a typical microwave transistor. This leads to gain compression, in the presence of the electron discontinuity, at a current density in the range of 20 amperes/square centimeter (A/cm²) to $5\times10^4$ A/cm². The experimental values are closer to the high end of this range, but still seriously limit the device operation by limiting the emitter charging frequency $g_m/(2\pi C_e)$, where $g_m$ is the dynamic emitter conductance and $C_e$ is the emitter junction capacitance.

Figure 4:
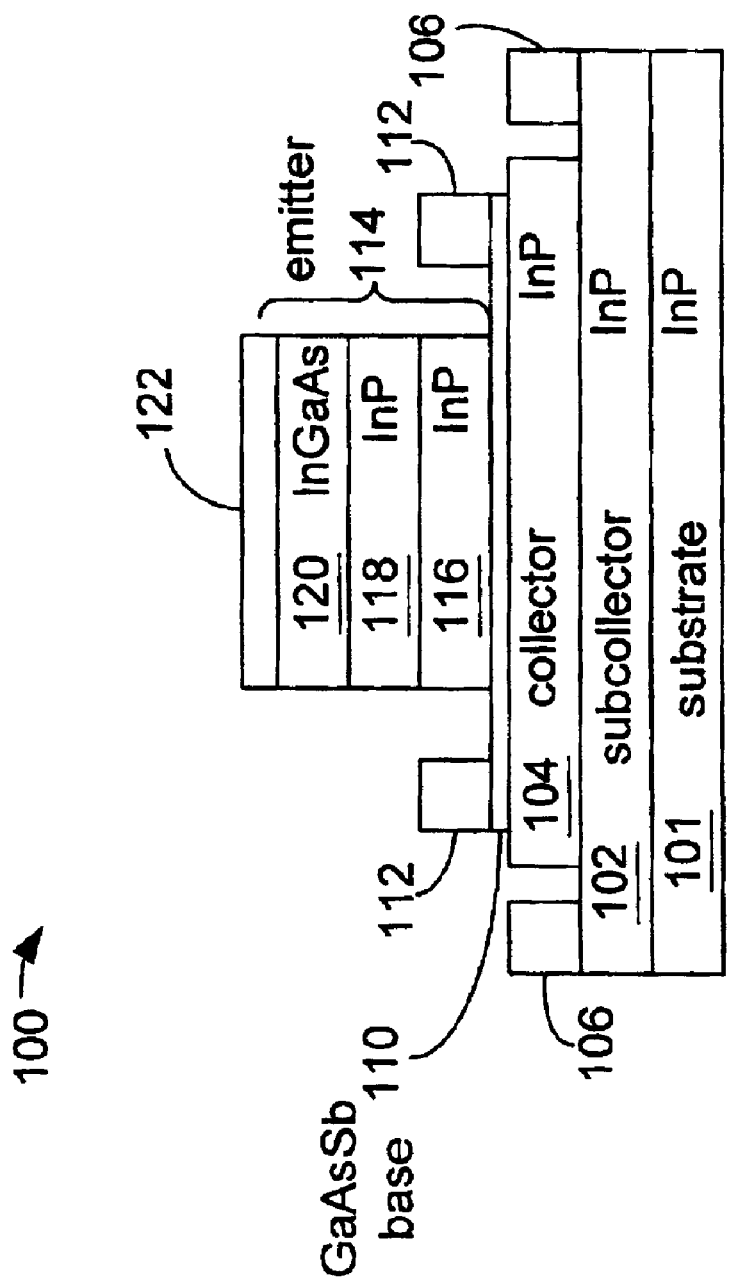
FIG. 4 is a cross-sectional view illustrating an HBT constructed in accordance with an aspect of the invention.

FIG. 4 is a cross-sectional view illustrating a simplified HBT 100 constructed in accordance with the invention. The HBT 100 includes an InP substrate 101 over which a heavily n-doped subcollector layer 102 is grown. An n-doped InP collector layer 104 is grown over the subcollector layer 102. Metal contacts 106 are applied over portions of the subcollector layer 102 as shown.

A heavily p-doped GaAsSb base layer 110 having a thickness of less than 49 nm, and preferably about 20 nm, is grown over the InP collector layer 104 and metal contacts 112 are applied to portions of the base layer 110 as shown. The base layer 110 can be grown having different compositions.

In accordance with one embodiment of the invention, the material of the base layer 110 has a composition that results in a bulk lattice constant that matches the bulk lattice constant of the InP collector layer 104. This lattice match is achieved using GaAsSb with an arsenic fraction in the range from approximately 50 to approximately 51%. Growing such a thin base layer structure increases the base series resistance $R_b$. Therefore, the thin lattice matched GaAsSb base layer 110 is preferably highly doped to a concentration of approximately $6\times10^{19}$ acceptors/cm³. Because of the doping behavior of the GaAsSb, the base layer 110 can be made thin and highly doped, thus maintaining a high current gain.

In an alternative embodiment, the thin GaAsSb base layer 110 is grown having an arsenic fraction generally in the range from more than 51% to about 65%, preferably in the range from more than 51% to about 60%, more preferably in the range from about 54% to 56% and most preferably about 55%. These arsenic fractions result in a base layer material having a bulk lattice constant that differs from the bulk lattice constant of the InP collector layer 104. With an arsenic fraction in the above ranges and a thickness as defined above, the GaAsSb base layer 110 will grow pseudomorphically, referred to as "strained," without cracks. In this manner, the lattice parameter of the GaAsSb base layer 110 conforms to the lattice parameter of the InP collector 104 and to the InP emitter 114.

As known to those having ordinary skill in the art, the lattice constant in a pseudomorphic layer is stretched or compressed so that it matches the substrate lattice in the two dimensions perpendicular to the growth direction. Although the lattice parameter in the growth direction will be completely different, the lattice constant presented by the pseudomorphic surface to incoming constituent atoms during growth is the same as a lattice-matched surface. Therefore, physically, the use of a thin pseudomorphic layer as the base layer 110 is very similar to the use of a perfectly lattice-matched base layer 110.

When the base layer 110 is constructed using $GaAs_xSb_{1-x}$, where X is 0.51, as in the first embodiment, the base layer will be nearly unstrained and almost perfectly lattice-matched to the InP collector layer 104. However, if X is substantially different from 0.51 the bulk lattice constant of the GaAsSb base layer 110 would be mismatched with respect to the InP collector layer 104. In such a case, the GaAsSb base layer 110 can be grown sufficiently thin and without cracks to be pseudomorphic so that its lattice constant conforms to the lattice constant of the InP collector layer 104 and the InP layers in the emitter 114. Increasing the arsenic fraction in the GaAsSb base layer 110 from about 51% to about 60% reduces the conduction band discontinuity, $\Delta E_c$, by approximately 0.05 eV relative to a lattice-matched base.

A high base doping level of the GaAsSb base layer 110 is used to reduce the sheet resistivity and lower the base series resistance, $R_b$, that results from the thinly grown base layer 110. In essence, the high base-doping that is possible in GaAsSb, and the small value of C, in Eq. (2) above, associated with GaAsSb enables the use of thin bases to reduce base transit time and provide good current gain while maintaining reasonably low base series resistance, $R_b$. The thinness of the base permits the use of GaAsSb compositions that are not lattice-matched to InP, but that can be grown sufficiently thin and pseudomorphic with good crystalline quality. The freedom to make adjustments to the composition of the base material allows adjustment of the conduction band discontinuity between the base and the emitter. In this manner, the current gain can be increased and current operation higher than that possible in transistors having lattice-matched bases can be achieved. Preferably, the base layer 110 is 20–40 nm thick and is doped with carbon (C) or beryllium (Be) to a concentration in the range of $6\times10^{19}$ to $4\times10^{20}$ acceptors/cm³.

The emitter 114 comprises a lightly n-doped InP layer 116 grown over the base layer 110. A heavier n-doped InP layer 118 is grown over the InP layer 116, and a heavily n-doped InGaAs layer 120 is grown over the InP layer 118. These two layers 118 and 120 provide an ohmic contact between the emitter 114 and the metal contact 122. The layers 116 and 118 may also be constructed using AlInAs. The composition of the AlInAs is chosen to result in a lattice constant that matches the lattice constant of the collector layer 104.

Because the base layer 110 has a lattice constant that conforms to the lattice constant of the InP collector layer 104, the lattice constant of the AlInAs layers 116 and 118 in the emitter 114 will also conform to the lattice constant of the base layer 110. The subcollector layer 102, collector layer 104, base layer 108, intermediate layer 110 and the emitter 114 can be grown using, for example but not limited to, molecular beam epitaxy (MBE).

Based on experimental realizations of GaAsSb base HBTs, it is believed that the material constants that go into Equations 1, 2 and 3 above are quite different from the values for InGaAs. The dependence of hole mobility on hole concentration in the $5 \times 10^{19}$ to $5 \times 10^{20}$ range appears to be small, so $\epsilon \sim 0$. Base recombination is dominated by a combination of interface recombination and radiative recombination, while Auger recombination is negligible.

Hence, for an GaAsSb base HBT, Eq. (2) becomes:

$$1/\tau_B \approx 1/\tau_{RAD} + 1/\tau_{INTERFACE} \approx BN_A + v_{interface}/W_B \quad \text{(Eq. 4)}.$$

Figure 1:
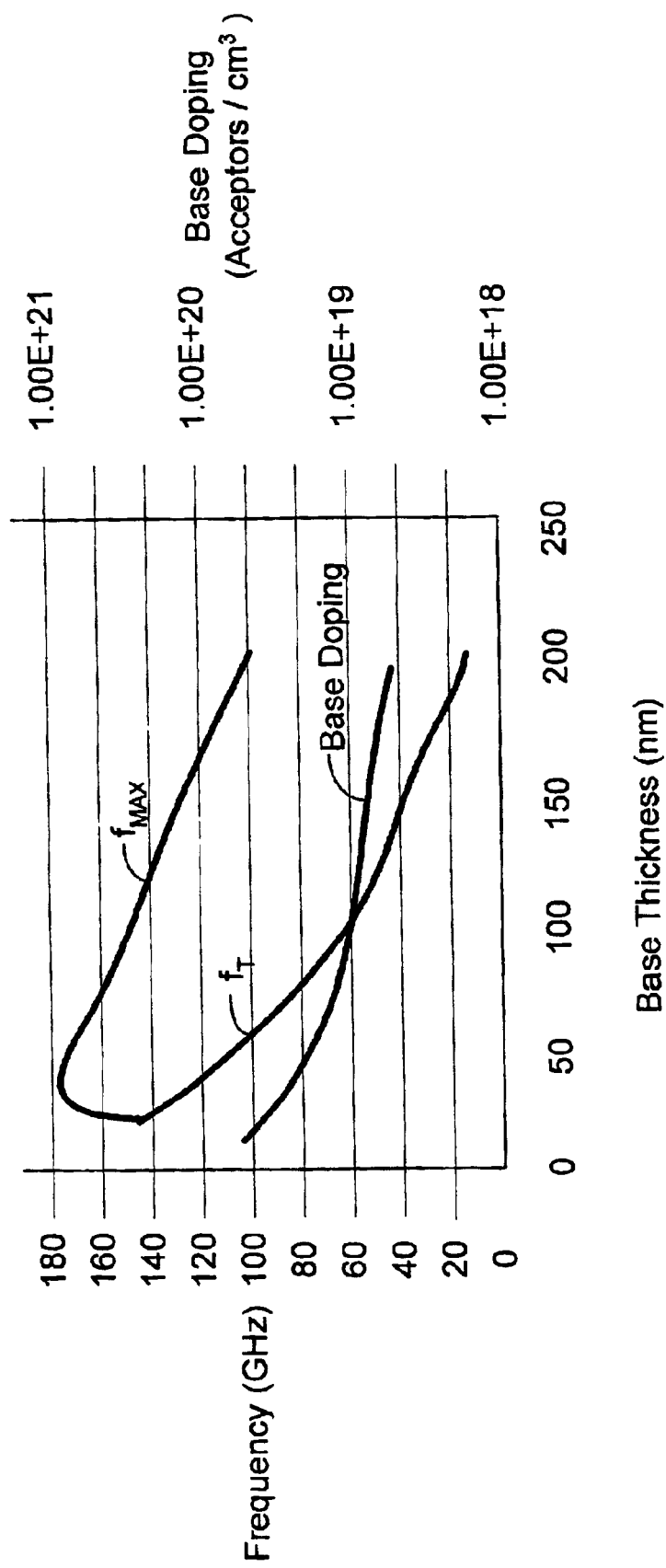
FIG. 1 illustrates the scaling behavior for $f_T$, $f_{MAX}$, and the base doping in an InGaAs base HBT constrained to have a current gain of 50 as a function of the base layer thickness.
Figure 5:
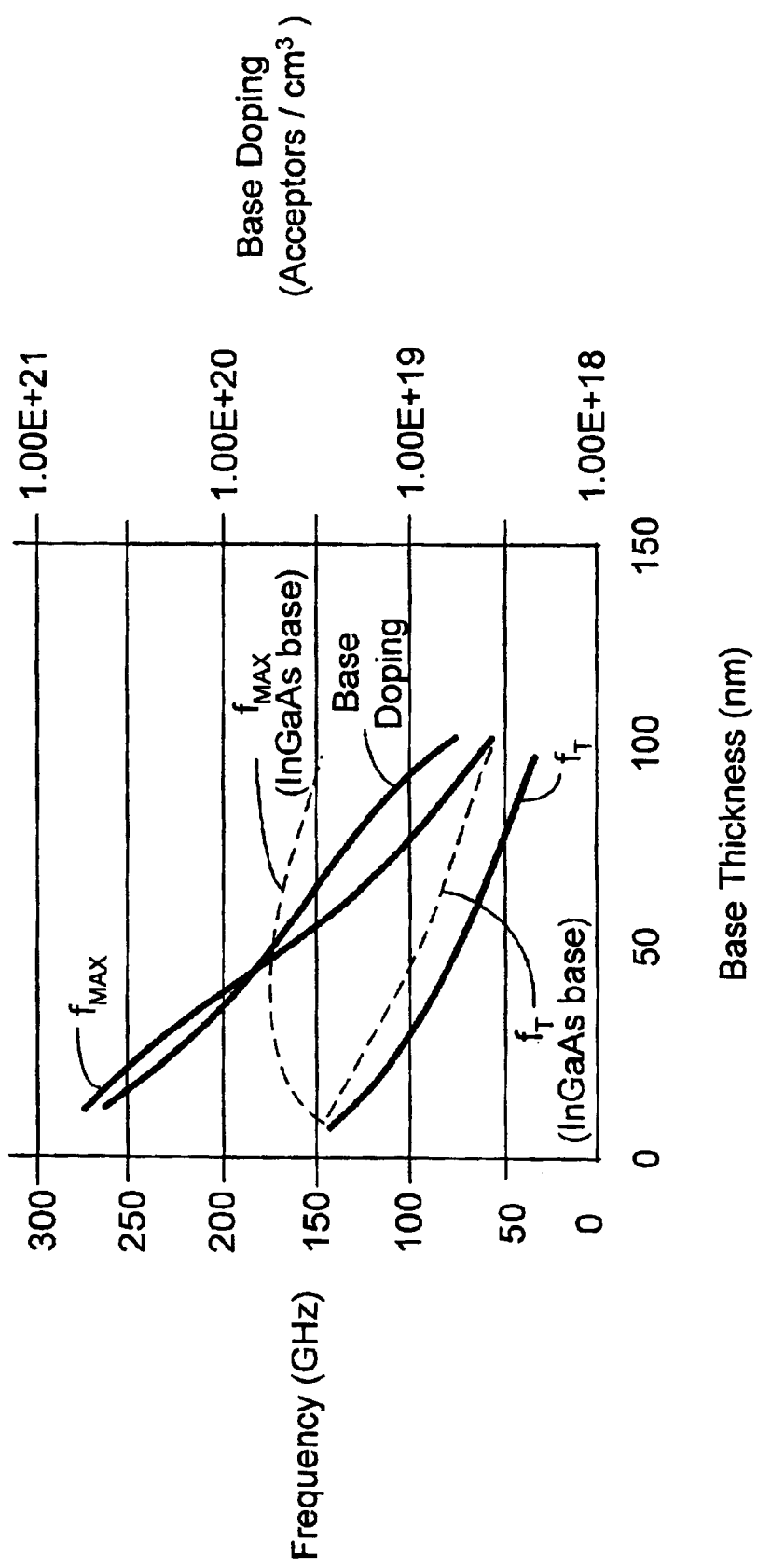
FIG. 5 is a graphical illustration of the scaling behavior of $f_T$, $f_{MAX}$ and the base doping in an HBT constructed according to a first embodiment having a thin GaAsSb base and constrained to have a current gain of 50 as a function of the base layer thickness.

FIG. 5 is a graphical illustration of the scaling behavior of $f_T$, $f_{MAX}$ and the base doping in an HBT constructed according to the first embodiment having a thin GaAsSb base and constrained to have a current gain of 50 as a function of the base layer thickness. The electron mobility, and hence diffusivity, of electrons in highly p-doped GaAsSb is less than in InGaAs so that the transit time is a stronger function of base thickness. As illustrated, both $f_{MAX}$ and $f_T$ are greatly improved by scaling to small base thickness. The cutoff frequency $f_T$ and the maximum operational frequency $f_{MAX}$ are shown with respect to the left axis and the base doping is shown with respect to the right axis. For reference, the $f_T$ and $f_{MAX}$ scaling behavior of the InGaAs base transistor, illustrated in FIG. 1, is shown as dashed lines.

It should be mentioned that an HBT having an InGaAs base exhibits improved $f_T$ compared to an HBT having a GaAsSb base of the same thickness throughout the scaling range. As such, the thickness of the GaAsSb base of an HBT, the characteristics of which are shown in FIG. 5, can always be made thinner in order to achieve the same $f_T$ and a significantly better $f_{MAX}$. The preferred base thickness is in the range of 10–49 nm with a doping concentration of about $6 \times 10^{19}$ acceptors/cm$^3$ up to about $4 \times 10^{20}$ acceptors/cm$^3$. The upper end of this range may be limited by material problems associated with very heavy carbon doping, but problem-free doping up to $1 \times 10^{20}$ has been demonstrated.

Above it was demonstrated that the conduction band discontinuity $\Delta E_c$ can lead to increased recombination current at the emitter-base metallurgical junction because of increased radiative and trap-assisted recombination. The radiative recombination problem can nearly always be mitigated by reducing that discontinuity. The term $K_{s-i-rad} \, p_{base}$ for spatially indirect radiative recombination contributes to the radiative term $1/\tau_{RAD} = BN_A$ in Eq. 2 as does bulk radiative recombination. The term $K_{s-i-rad} \, p_{base}$ comes from the overlap of the electron and hole wave functions near the metallurgical junction. Qualitatively, the spatially indirect radiative recombination comes from holes tunneling into the emitter and overlapping with real electrons, and from electrons tunneling into the base, and overlapping with real holes. The term for spatially indirect radiative recombination takes the form that it does because the relative sizes of the conduction and valence band discontinuities lead to much stronger tunneling of electrons than of holes. Thus, the constant $K_{s-i-rad}$ reflects the integral of the tunneling electron wave functions into the base. The value of $K_{s-i-rad}$ increases slowly as $\Delta E_c$ is reduced when compared to the exponential decrease of $n_e$ (at constant $n_b$, and hence injection current) as $\Delta E_c$ is reduced. This holds true as long as $\Delta E_c$ is large compared to kT/q. The trap-assisted recombination is equally sensitive to reduction of $\Delta E_c$ since it also depends on $n_e$, but that reduction is accomplished without substantially increasing the interface trap density $N_T$. Therefore, the scalability of the GaAsSb base HBT makes it possible to reduce the conduction band disconitinuity $\Delta E_c$ by increasing the As content in the base layer.

Figure 6:
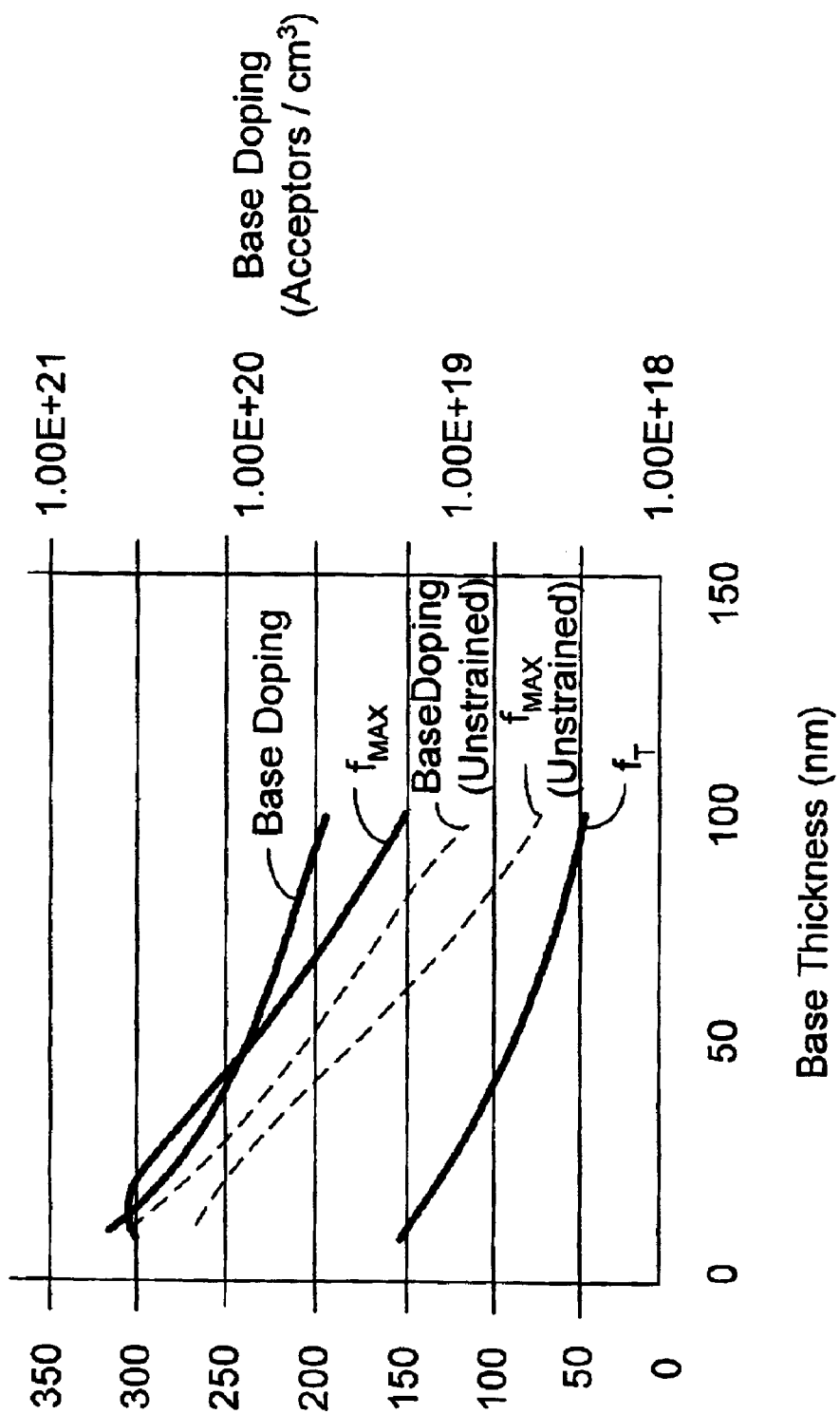
FIG. 6 is a graphical illustration of the scaling behavior of $f_T$, $f_{MAX}$ and the base doping in an HBT constructed according to an alternative embodiment having a thin GaAs$_{0.62}$Sb$_{0.38}$ base layer composition grown pseudomorphically over an InP collector and constrained to have a current gain of 50 as a function of the base layer thickness.

FIG. 6 is a graphical illustration of the scaling behavior of $f_T$, $f_{MAX}$ and the base doping in an HBT according to the alternative embodiment having a thin GaAs$_{0.62}$Sb$_{0.38}$ base layer composition grown pseudomorphically over an InP collector and constrained to have a current gain of 50 as a function of the base layer thickness. The cutoff frequency $f_T$ and the maximum operational frequency $f_{MAX}$ are shown with respect to the left axis and the base doping is shown with respect to the right axis. For reference, the base doping and $f_{MAX}$ scaling behavior of the unstrained GaAsSb base transistor, illustrated in FIG. 5, is shown as dashed lines. The $f_T$ scaling behavior is nearly unchanged with respect to FIG. 5.

The strained GaAsSb base layer 110 exhibits a high degree of crystalline perfection both in the bulk and at the emitter base interface. By using alloys that are rich in As, the conduction band discontinuity, $\Delta E_c$, can be reduced. Using alloys in the range of 0.60 As for 20 nm thick bases results in an HBT having better gain at the same doping concentration than an HBT having a base layer that is lattice-matched to the collector layer and the emitter. This in turn leads to the possibility of using a higher doping density in the base to improve $f_{MAX}$. FIG. 6 illustrates the improvement in both $f_T$ and $f_{MAX}$ for a 0.05 eV reduction of $\Delta E_c$.

Figure 7:
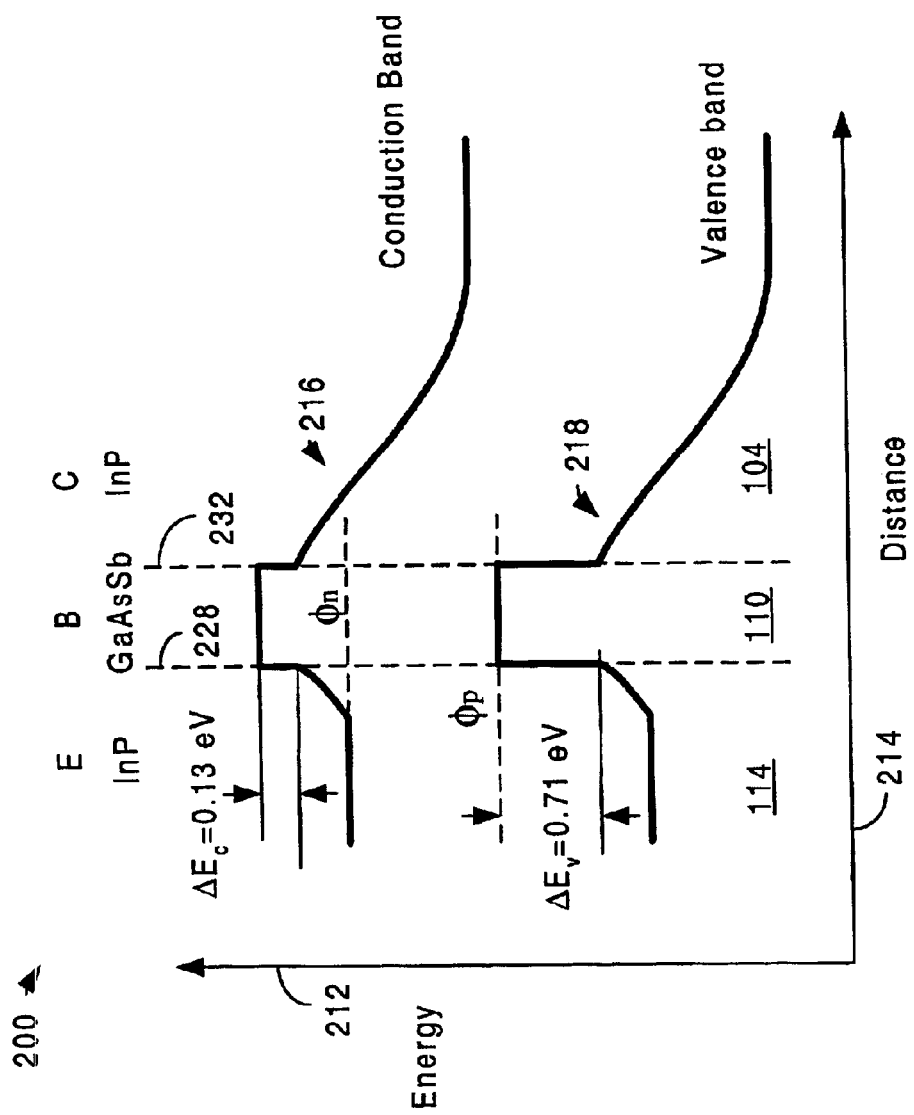
FIG. 7 is a graphical illustration 200 showing an energy band diagram of the InP emitter/GaAsSb base/InP collector HBT of FIG. 6.

FIG. 7 is a graphical illustration showing an energy band diagram 200 of the InP emitter/GaAsSb base/InP collector HBT of FIG. 6. The vertical axis 212 represents the energy level and the horizontal axis 214 represents distance. That is, the thickness of the material that respectively comprises the emitter region 114, the base region 110 and the collector region 104. The energy discontinuity $\Delta E_c$ in the conduction band 216 is about 0.13 eV and the energy discontinuity $\Delta E_v$ in the valence band 218 is about 0.71 eV. The 0.13 eV discontinuity in the conduction band 216 represents an approximate 0.05 eV improvement with respect to that shown in FIG. 3.

It will be apparent to those skilled in the art that many modifications and variations may be made to the preferred embodiments of the present invention, as set forth above, without departing substantially from the principles of the present invention. For example, both npn and pnp HBTs can benefit from the concepts of the invention. All such modifications and variations are intended to be included herein within the scope of the present invention, as defined in the claims that follow.

What is claimed is:

1. A heterojunction bipolar transistor (HBT), comprising:
   a collector;
   an emitter; and
   a base located between the collector and the emitter, the base including a layer of gallium arsenide antimonide (GaAsSb) less than 49 nanometers (nm) thick and having an arsenic (As) fraction in a range from about 50% to about 65%.

2. The HBT of claim 1, wherein the gallium arsenide antimonide of the base has an arsenic (As) fraction in a range from about 50% to about 51%.

3. The HBT of claim 1, wherein the gallium arsenide antimonide of the base has an arsenic (As) fraction in a range from about 50% to about 60%.

4. The HBT of claim 1, wherein the gallium arsenide antimonide of the base has an arsenic (As) fraction in a range from about 54% to about 56%.

5. The HBT of claim 1, wherein the gallium arsenide antimonide of the base has an arsenic (As) fraction of approximately 55%.

6. The HBT of claim 1, wherein the base layer of GaAsSb is less than 20 nm thick.

7. The HBT of claim 1, wherein the base layer or GaAsSb is strained so that its lattice constant conforms to the lattice constant of the collector and the emitter.

8. The HBT of claim 1, wherein the base layer of GaAsSb is doped with beryllium (Be) at a doping concentration of between approximately $6\times10^{19}$ and $4\times10^{20}$ acceptors/cm$^3$.

9. The HBT of claim 1, wherein the base layer of GaAsSb is doped with carbon (C) at a doping concentration of between approximately $6\times10^{19}$ and $4\times10^{20}$ acceptors/cm$^3$.

10. The HBT of claim 8, wherein the base layer of GaAsSb is doped with carbon (C) at a doping concentration or between approximately $6\times10^{19}$ and $4\times10^{20}$ acceptors/cm$^3$.

11. A method for making a heterojunction bipolar transistor (HBT), the method comprising the steps of:
    forming a collector;
    forming an emitter; and
    forming a base located between the collector and the emitter, the base including a layer of gallium arsenide antimonide (GaAsSb) less than 49 nanometers (nm) thick and having an arsenic (As) fraction in a range from about 50% to about 65%.

12. The method of claim 11, wherein the base is formed of gallium arsenide antimonide having an arsenic (As) fraction in a range from about 50% to about 51%.

13. The method of claim 11, wherein the base is formed gallium arsenide antimonide having an arsenic (As) fraction in a range from about 50% to about 60%.

14. The method of claim 11, wherein the base is formed of gallium arsenide antimonide having an arsenic (As) fraction in a range from about 54% to about 56%.

15. The method of claim 11, wherein the base is formed of gallium arsenide antimonide having an arsenic (As) fraction of approximately 55%.

16. The method of claim 11, wherein the base layer of GaAsSb is less than 20 nm thick.

17. The method of claim 11, further comprising the step of straining the base layer of GaAsSb so that its lattice constant conforms to the lattice, constant of the collector and the emitter.

18. The method of claim 11, further comprising the step of doping the base layer of GaAsSb with beryllium, (Be) at a doping concentration of between approximately $6\times10^{19}$ and $4\times10^{20}$ acceptors/cm$^3$.

19. The method of claim 11, further comprising the step of doping the base layer of GaAsSb with carbon (C) at a doping concentration of between approximately $6\times10^{19}$ and $4\times10^{20}$ acceptors/cm$^3$.

20. A heterojunction bipolar transistor (HBT), comprising:
    a collector including indium phosphide (InP);
    an emitter including InP; and
    a base including a layer of gallium arsenide antimonide (GaAsSb) located between the collector and the emitter, the base layer being less than 49 nanometers (nm) thick and having an arsenic fraction of approximately 55% and a doping concentration of between approximately $6\times10^{19}$ and $4\times10^{20}$ acceptors/cm$^3$.

21. The HBT of claim 20, wherein the base layer of GaAsSb is less than 20 nm thick.

22. The HBT of claim 20, wherein the base layer of GaAsSb is strained so that its lattice constant conforms to the lattice constant of the collector and the emitter.

23. The HBT of claim 20, where the HBT as configured as an npn transistor.

24. A heterojunction bipolar transistor (HBT), comprising:
    a collector;
    an emitter; and
    a base located between the collector and the emitter, the base including a layer of gallium arsenide antimonide (GaAsSb) less than 20 nanometers (nm) thick.

25. The HBT of claim 24, wherein the gallium arsenide antimonide of the base has an arsenic (As) fraction in a range from about 50% to about 65%.

26. The HBT of claim 24, wherein the base layer of GaAsSb is doped with beryllium (Be) at a doping concentration of between approximately $6\times10^{19}$ and $4\times10^{20}$ acceptors/cm$^3$.

27. The HBT of claim 24, wherein the base layer of GaAsSb is doped with carbon (C) at a doping concentration of between approximately $6\times10^{19}$ and $4\times10^{20}$ acceptors/cm$^3$.

28. A heterojunction bipolar transistor (HBT), comprising:
    a collector;
    an emitter; and
    a base located between the collector and the emitter, the base including a layer of gallium arsenide antimonide (GaAsSb) less than 49 nanometers (nm) chick and strained so that its lattice constant conforms to the lattice constant of the collector and the emitter.

29. The HBT of claim 28, wherein the gallium arsenide antimonide of the base has an arsenic (As) fraction in a range from about 50% to about 65%.

30. The HBT of claim 28, wherein the base layer of GaAsSb is less than 20 nm thick.

31. The HBT of claim 28, wherein the base layer of GaAsSb is doped with beryllium (Be) at a doping concentration of between approximately $6\times10^{19}$ and $4\times10^{20}$ acceptors/cm$^3$.

32. A method for making a heterojunction bipolar transistor (HBT), the method comprising the steps of:
    forming a collector;
    forming an emitter; and
    forming a base located between the collector and die emitter, the base including a layer of gallium arsenide antimonide (GaAaSb) less than 20 nanometers (nm) thick.

33. The method of claim 32, wherein the base is formed of gallium arsenide antimonide having an arsenic (As) fraction in a range from about 50% to about 65%.

34. The method of claim 32, further comprising the step of doping the base layer of GaAsSb with beryllium (Be) at a doping concentration of between approximately $6\times10^{19}$ and $4\times10^{20}$ acceptors/cm$^3$.

35. The method of claim 32, further comprising the step of doping the base layer of GaAsSb with carbon (C) at a doping concentration of between approximately $6\times10^{19}$ and $4\times10^{20}$ acceptors/cm$^3$.

36. A method for making a heterojunction bipolar transistor (HBT), the method comprising the steps of:
  forming a collector;
  forming an emitter;
  forming a base located between the collector and the emitter, the base including a layer of gallium arsenide antimonide (GaAsSb) less than 49 nanometers (nm) thick; and
  straining the base layer of GaAsSb so that its lattice constant conforms to the lattice constant of the collector and the emitter.

37. The method of claim 36, wherein the base is formed of gallium arsenide antimonide having an arsenic (As) fraction in a range from about 50% to about 65%.

38. The method of claim 36, wherein the base layer of GaAsSb is less than 20 nm thick.

39. The method of claim 36, further comprising the step of doping the base layer of GaAsSb with beryllium (Be) at a doping concentration of between approximately $6 \times 10^{19}$ and $4 \times 10^{20}$ acceptors/cm$^3$.

* * * * *